(12) United States Patent
Platow et al.

(10) Patent No.: US 10,573,485 B1
(45) Date of Patent: Feb. 25, 2020

(54) TETRODE EXTRACTION APPARATUS FOR ION SOURCE

(71) Applicant: Axcelis Technologies, Inc., Beverly, MA (US)

(72) Inventors: Wilhelm Platow, Newburyport, MA (US); Edward Eisner, Lexington, MA (US); Bo Vanderberg, Gloucester, MA (US); Neil Bassom, Hamilton, MA (US); Michael Cristoforo, Beverly, MA (US); Joshua Abeshaus, Salem, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/227,296

(22) Filed: Dec. 20, 2018

(51) Int. Cl.
  *H01J 37/08* (2006.01)
  *H01J 37/317* (2006.01)

(52) U.S. Cl.
  CPC .......... *H01J 37/08* (2013.01); *H01J 37/3171* (2013.01); *H01J 2237/08* (2013.01); *H01J 2237/31701* (2013.01)

(58) Field of Classification Search
  CPC .................. H01J 37/08; H01J 37/3171; H01J 2237/31701; H01J 2237/08
  USPC ..... 250/396 R, 398, 423 R, 424, 426, 492.1, 250/492.2, 492.21, 492.22, 492.3
  See application file for complete search history.

(56) References Cited

U.S. PATENT DOCUMENTS

| | | | |
|---|---|---|---|
| 5,661,308 A | 8/1997 | Benveniste | |
| 6,452,338 B1 | 9/2002 | Horsky | |
| 6,559,454 B1 | 5/2003 | Murrell | |
| 6,777,696 B1 | 8/2004 | Rathmell | |
| 2015/0136996 A1* | 5/2015 | Inada | H01J 37/3171 250/396 R |

* cited by examiner

*Primary Examiner* — Nicole M Ippolito
*Assistant Examiner* — Hanway Chang
(74) *Attorney, Agent, or Firm* — Eschweiler & Potashnik, LLC

(57) ABSTRACT

An electrode system for an ion source has a source electrode that defines a source aperture in an ion source chamber, and is coupled to a source power supply. A first ground electrode defines a first ground aperture that is electrically coupled to an electrical ground potential and extracts ions from the ion source. A suppression electrode is positioned downstream of the first ground electrode and defines a suppression aperture that is electrically coupled to a suppression power supply. A second ground electrode is positioned downstream of the suppression electrode and defines a second ground aperture. The first and second ground electrodes are fixedly coupled to one another and are electrically coupled to the electrical ground potential.

20 Claims, 4 Drawing Sheets

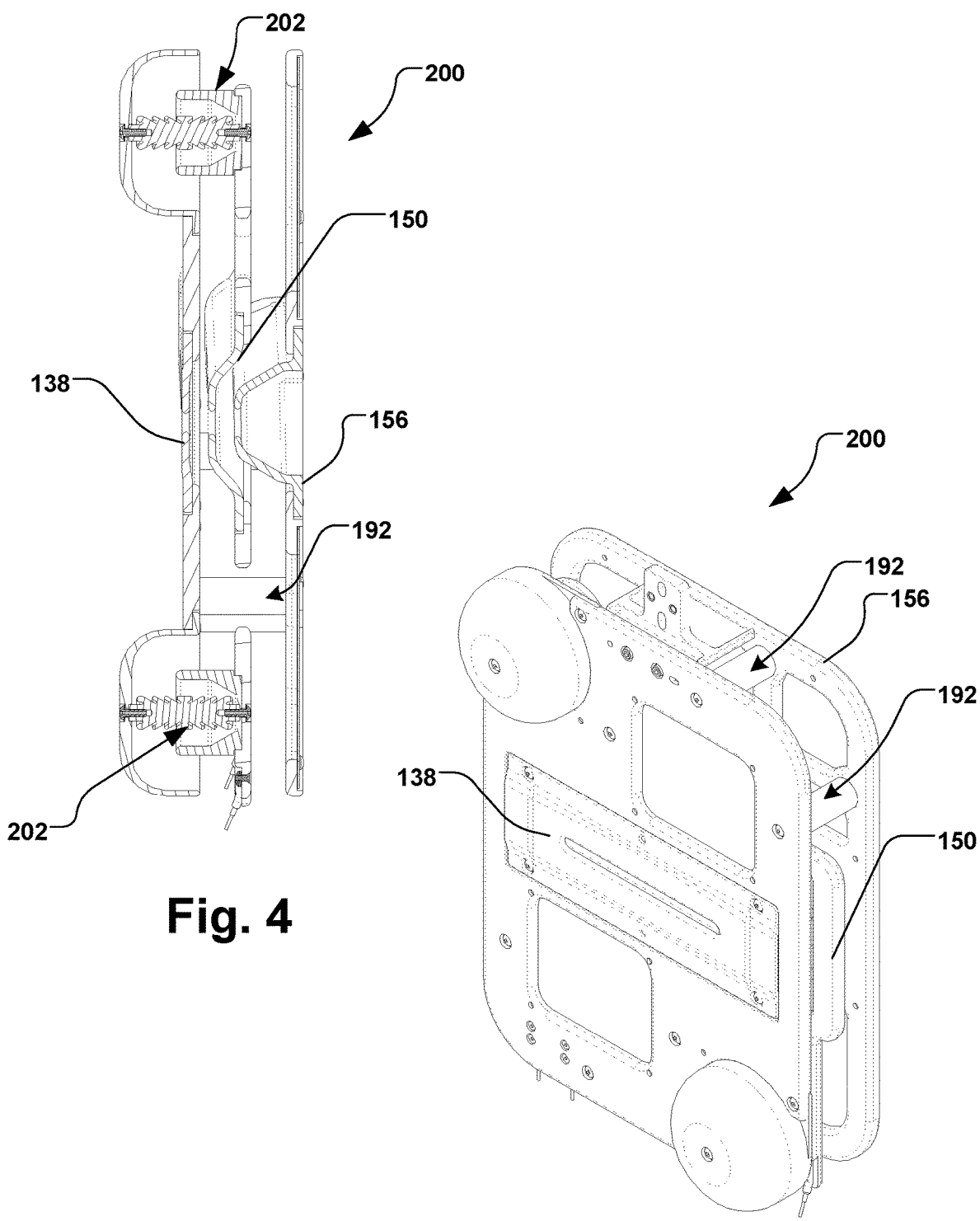

TETRODE EXTRACTION APPARATUS FOR ION SOURCE

FIELD OF THE INVENTION

The present invention relates generally to ion implantation systems and more specifically to a tetrode extraction apparatus with ground-suppression-ground electrodes for an ion source for a high current ion implanter.

BACKGROUND OF THE INVENTION

In the manufacture of semiconductor devices and other ion related products, ion implantation systems are used to impart dopant elements into semiconductor wafers, display panels, or other types of workpieces. Typical ion implantation systems or ion implanters impact a workpiece with an ion beam utilizing a known recipe or process in order to produce n-type or p-type doped regions, or to form passivation layers in the workpiece. When used for doping semiconductors, the ion implantation system injects selected ion species to produce the desired extrinsic material. Typically, dopant atoms or molecules are ionized and isolated, sometimes accelerated or decelerated, formed into a beam, and implanted into a workpiece. The dopant ions physically bombard and enter the surface of the workpiece, and subsequently come to rest below the workpiece surface in the crystalline lattice structure thereof.

In a conventional ion implantation system, a so-called "triode" design is utilized for extraction of an ion beam from an ion source, whereby a suppression electrode and a ground electrode are positioned in front of an opening of the ion source to extract the ion beam. The ion beam is subsequently analyzed by an AMU or mass analyzer magnet. With high extraction currents (e.g., so-called "high current implanters"), however, the ion beam will have a tendency to expand or "blow up" due to space charge, whereby individual ions of the ion beam tend to repel each other. When extracting a positive ion beam, for example, the positive ions repel each other due to electrostatic repulsion or space charge. Typically, residual gases are also present, thus creating secondary electrons that tend to neutralize the beam. However, in the extraction region, these secondary electrons get removed due to the strong electrostatic fields, thus preventing the beam from being neutralized. As such, the ion beam becomes larger and larger to the point that the whole ion beam can no longer be transported through the mass analyzer magnet, and gets clipped at the top and bottom of the ion beam.

As opposed to utilizing a triode design for extracting the ion beam, a "tetrode" design may be utilized, whereby a greater degree of flexibility is achieved. Referring initially to FIG. 1, a conventional tetrode extraction assembly 10 is illustrated, as disclosed in U.S. Pat. No. 6,559,454. The tetrode extraction assembly 10 comprises a housing 15 having an arc chamber 20A mounted thereto. A bushing 20B acts as an insulator to isolate a plasma source 20 from the remainder of the housing 15. Ions formed in the arc chamber 20A are extracted from the plasma source 20 through an exit aperture 21 in a front face of the source 20, therein defining a source electrode 22 at a source potential of the plasma source 20. Each of an extraction electrode 23, a suppression electrode 24 and a ground electrode 25, respectively referred hereafter as E-S-G, comprise conductive plates having a respective aperture therethrough to allow the ion beam 30 to pass and emerge from the ion source assembly 10.

For positive ion beams 30, for example, the ion source 20 is biased to a large positive potential (10-90 kV), whereby a final energy of the ion beam 30 is generally determined. The extraction electrode 23 is biased negative to the source potential associated with the source electrode 22 to extract ions from the plasma source 20, and the suppression electrode 24 is biased negative with respect to the ground electrode 25 to prevent electrons downstream of the ground electrode from back-streaming to the plasma source, and thus maintaining beam neutralization. The extraction electrode 23 is typically mounted on arms 43 to the plasma source 20 with an insulator 44 and is biased with a power supply with respect to the plasma source.

The conventional tetrode extraction assembly 10 uses three power supplies (not shown) and respective feed-throughs (not shown) to respectively power the source electrode 22, extraction electrode 23, and suppression electrode 24, whereby coating and/or electrical shorting may be experienced. Further, the conventional ion source assembly 10 may suffer from coating of the insulator 44 associated with the extraction electrode or other electrical shorting between insulators. Additionally, having four apertures associated with the source electrode 22, extraction electrode 23, suppression electrode 24, and ground electrode 25, respectively, various issues related to the alignment of all four apertures may be problematic.

SUMMARY OF THE INVENTION

The present invention overcomes the limitations of the prior art by providing an efficient extraction electrode system for a high current ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the disclosure in a simplified form as a prelude to the more detailed description that is presented later.

In accordance with one exemplary aspect of the disclosure, an electrode system for an ion source is provided, wherein the electrode system comprises a source electrode associated with the ion source. The source electrode generally defines a source aperture in an outside wall of an ion source chamber, wherein the source aperture is configured to be electrically coupled to a source power supply. A first ground electrode is positioned proximate to the source electrode, wherein the first ground electrode generally defines a first ground aperture. The first ground electrode is electrically coupled to an electrical ground potential and configured to extract ions from the ion source along a beamline. A suppression electrode is positioned downstream of the first ground electrode along the beamline, wherein the suppression electrode generally defines a suppression aperture. The suppression electrode, for example, is configured to be electrically coupled to a suppression power supply.

A second ground electrode is further positioned downstream of the suppression electrode along the beamline. The second ground electrode generally defines a second ground aperture, wherein in one example, the first ground electrode and second ground electrode are fixedly coupled to one another and are electrically coupled to the electrical ground potential.

In one example, the source electrode is electrically isolated from the first ground electrode by a source gap. The source power supply, for example, is configured to supply a source voltage to the source electrode that is positive relative to the ground potential. The suppression power supply, for example, may be configured to apply a negative potential to the suppression electrode relative to the ground electrodes.

In another example, the one or more ground rods fixedly couple the first ground electrode to the second ground electrode. The one or more ground rods, for example, are electrically conductive and electrically couple the first ground electrode to the second ground electrode. In another example, a grounding element is electrically coupled to one or more of the first ground electrode and second ground electrode, wherein the grounding element electrically couples the first ground electrode and second ground electrode to electrical ground. The grounding element, for example, may comprise one or more of a wire, a cable, and a rod.

In another example, the first ground electrode, suppression electrode, and second ground electrode are fixedly coupled to one another, wherein the suppression electrode is electrically insulated from the first ground electrode and second ground electrode. The first ground electrode, suppression electrode, and second ground electrode, for example, may generally define an extraction manipulator, wherein the extraction manipulator is configured to translate at least in one or more directions relative to the source.

According to another exemplary aspect, an ion source for an ion implantation system is provided, wherein an arc chamber has an interior region, and wherein the arc chamber is configured to form a plasma containing positive ions. A source electrode, generally defines a source aperture in an outside wall of the arc chamber and generally encloses the interior region of the arc chamber, wherein the source aperture is configured to be electrically coupled to a source power supply. A first ground electrode, for example, is positioned proximate to the source electrode, wherein the first ground electrode generally defines a first ground aperture, and wherein the first ground electrode is electrically coupled to an electrical ground potential and configured to extract the positive ions from the ion source along a beamline. A suppression electrode is further positioned downstream of the first ground electrode along the beamline, wherein the suppression electrode generally defines a suppression aperture, and wherein the suppression electrode is configured to be electrically coupled to a suppression power supply. A second ground electrode, for example, is positioned downstream of the suppression electrode along the beamline, wherein the second ground electrode generally defines a second ground aperture, and wherein the first ground electrode and second ground electrode are fixedly coupled to one another and are electrically coupled to the electrical ground potential.

In accordance with yet another exemplary aspect, an ion implantation system is provided, wherein the ion implantation system comprises an ion source configured to form a plasma, as in any of the examples described above. The ion implantation system further comprises a mass analyzer configured to mass analyze the ion beam along the beamline. An acceleration/deceleration apparatus is further provided and configured to accelerate or decelerate the ion beam to a desired implantation energy. Further, an end station is configured to support a workpiece for implantation along the beamline.

In one example, a vacuum chamber generally encloses at least the ion source and electrode system, wherein the source power supply and suppression power supply are not enclosed within the vacuum chamber. A vacuum source, such as a vacuum pump, is configured to provide a vacuum within the vacuum chamber, and one or more vacuum feedthroughs are further associated with the vacuum chamber. The one or more vacuum feedthroughs, for example, are configured to electrically couple the source power supply and suppression power supply to the respective source electrode and suppression electrode while maintaining the vacuum within the vacuum chamber. In one example, the first ground electrode and second electrode are at the same potential as the vacuum chamber.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4 illustrates a cross-sectional view of an ion source electrode apparatus according to another aspect of the present invention;

FIG. 5 is a perspective view of electrodes according to yet another exemplary aspect of the invention.

DETAILED DESCRIPTION OF THE INVENTION

Figure 1:
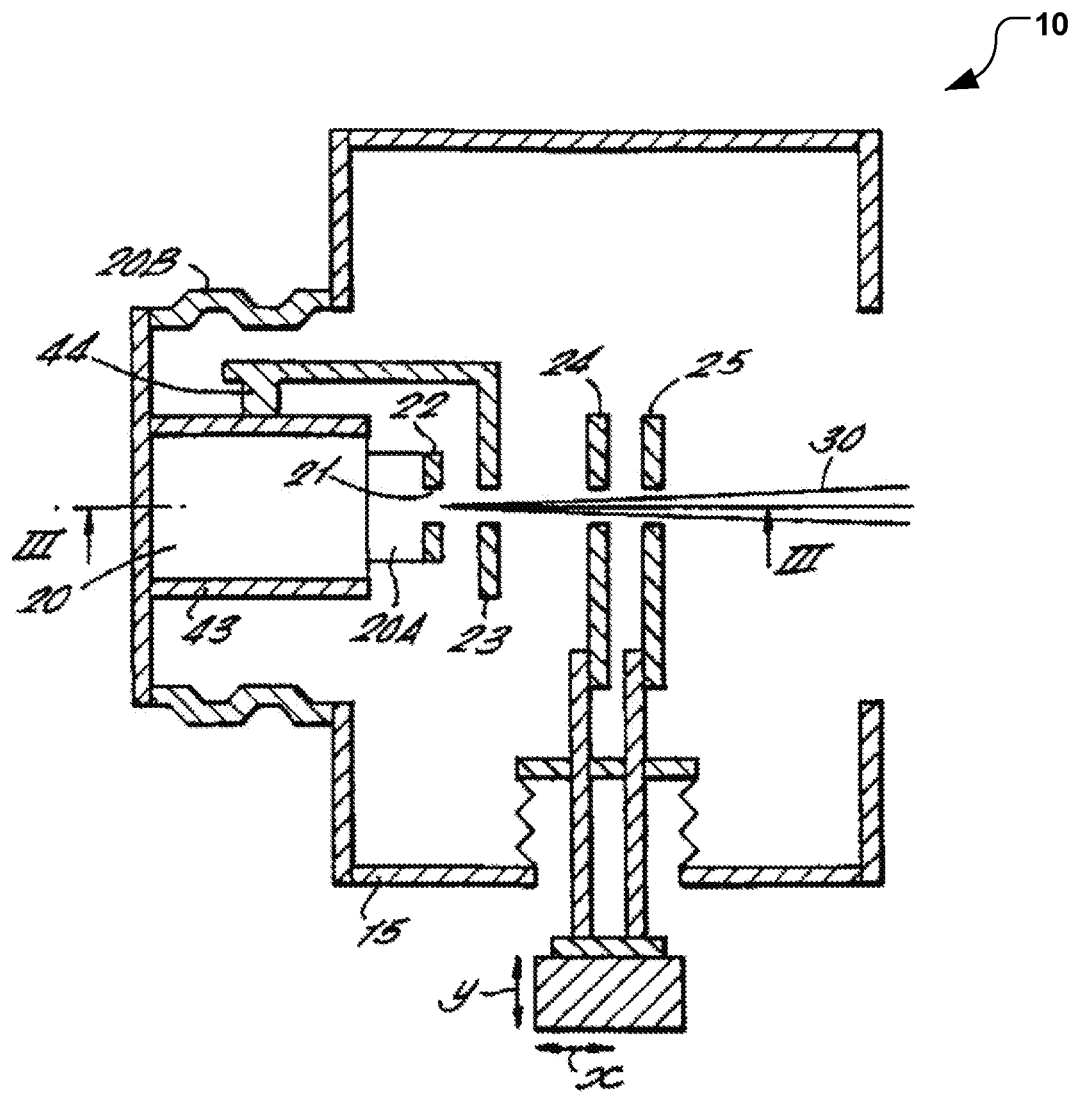
FIG. 1 is a schematic of a prior art ion source extraction apparatus.

The present invention is directed generally towards an improved ion extraction electrode apparatus, system, and method for use in an ion implantation system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 2:
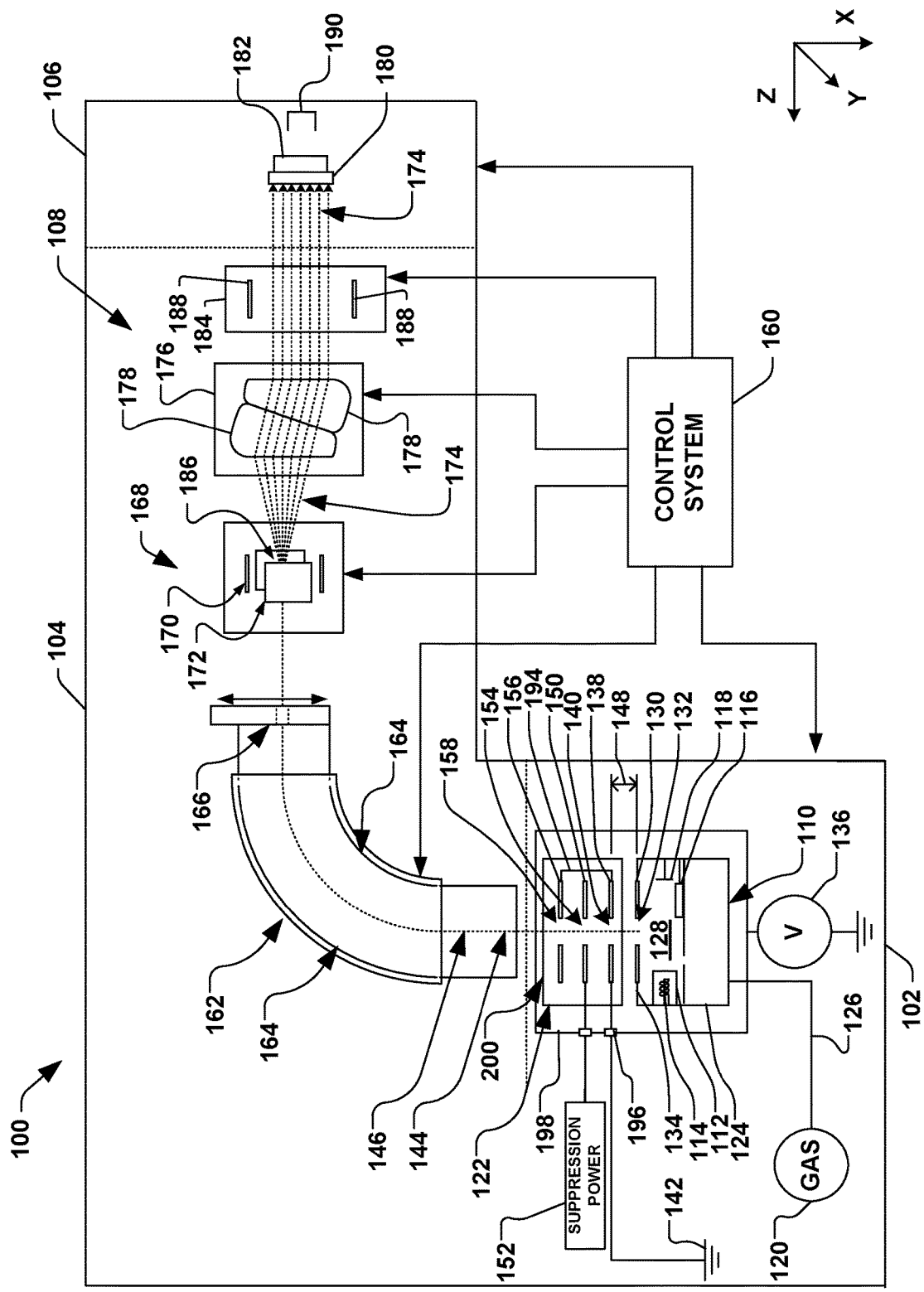
FIG. 2 illustrates an ion implantation system according to an aspect of the present invention.

In order to gain a better understanding of the present disclosure, FIG. 2 illustrates ion implantation system 100 in accordance with various exemplary aspects of the present disclosure. The system 100 is presented for illustrative purposes and it is appreciated that aspects of the disclosure are not limited to the described ion implantation system and that other suitable ion implantation systems of varied configurations can also be employed. The ion implantation system 100 has a terminal 102, a beamline assembly 104, and an end station 106 generally defining a beamline 108 of the ion implantation system.

In the example shown, the terminal 102 comprises an ion source 110 (e.g., a plasma generating component), a cathode 112, a filament 114 (e.g., a rod comprised of tungsten or tungsten alloy), an anode 116, a repeller 118, a gas source 120, and an ion source electrode system 122, as will be discussed in further detail infra. A dopant gas, for example, can be fed into an ion source chamber 124 of the ion source 110 from the gas source 120 through a gas conduit 126. The gas source 120 provides one or more precursor gases (e.g., via the conduit 126) into a region 128 of the ion source 102 wherein the ions are generated. The filament 114, for example, is heated (e.g., to approximately 2500° K) to excite electrons therein and in order to collide with molecules of the dopant gas supplied by the gas source 120. The cathode 112, for example, may be further powered to provide additional energy to cause thermionic emissions of electrons into the region 128 wherein the dopant gas is situated. The anode 116 assists with drawing the electrons into the region 128. The anode 116, for example, may include sidewalls 134 of the ion source 110. In one example, the anode 116 may be further powered such that a bias can be set up between the cathode 112 and the anode 116 in order to facilitate drawing additional electrons into the region 128.

The repeller 118, for example, can also assist with maintaining the electrons within the region 128. In particular, a bias imparted to the repeller 118 is configured to repel electrons emitted from the cathode 112 back into the region 128. Similarly, a magnetic field induced within the ion source 110 by source magnets (not shown) can serve to maintain electrons within the region 128 and off of the sidewalls of the source 110. The electrons moving within the region 128 collide with the dopant gas molecules provided from the gas source 120 to form or otherwise create the ions. In particular, electrons that collide with the dopant gas molecules with sufficient momentum cause one or more electrons to become dislodged from the dopant gas molecules, thus producing positively charged ions.

While not shown, the present disclosure contemplates various other types of ions sources other than the above-described arc discharge ion source. For example, an ion source may include a means of RF excitation to produce ions. Such a source is disclosed in U.S. Pat. No. 5,661,308, the entirety of which is hereby incorporated by reference. Other types of ion sources contemplated by the present disclosure may include an excitation by an electron beam injection to produce ions. An additional example of an ion source to which the present invention has application is an ion source that includes a microwave excitation to produce a plurality of ions.

In accordance with the present disclosure, a source electrode 130 is associated with the ion source 110, wherein the source electrode generally defines a source aperture 132 in an outside wall 134 of the ion source chamber 124. The source aperture 132, for example, is electrically coupled to a source power supply 136. The source power supply is configured to supply a source voltage to the source electrode that is positive relative to the ground potential (e.g., in the range of approximately 10-100 keV).

Further, a first ground electrode 138 is positioned proximate to the source electrode 130, wherein the first ground electrode generally defines a first ground aperture 140. The first ground electrode 138, for example, is electrically coupled to an electrical terminal ground potential 142, whereby the first ground electrode is thus configured to extract ions from the ion source 110 through the source aperture 132, thereby forming an ion beam 144 that generally defines a beamline 146. The source electrode 130, for example, is electrically isolated (e.g., electrically insulated) from the first ground electrode by a source gap 148.

The first ground electrode 138, being at ground potential, is thus biased negatively with respect to the ion source 110, thereby attracting positive ions thereto across the source gap 148. In accordance with one example, the ion beam 144 comprises a high energy ion beam (e.g., in the range of approximately 10-100 keV), however, other energies of the ion beam are also contemplated as falling within the scope of the present disclosure.

In accordance with an example of the present disclosure, a suppression electrode 150 is further provided for suppression of electrons which are attracted toward the ion source 110 along the beamline 146, whereby the suppression electrode is generally negatively biased relative to ground potential via a suppression power supply 152. The suppression power supply 152, for example, is configured to apply a negative potential to the suppression electrode 150 that is lower relative to the potential supplied to the source electrode 130 by the source power supply 136, while being positive relative to the terminal ground potential 142. The suppression electrode 150, for example, is configured to be electrically coupled to a suppression power supply and generally defines a suppression aperture 154 through which the ion beam 144 passes.

Further, a second ground electrode 156 is positioned downstream of the suppression electrode 150 along the beamline 146, whereby the second ground electrode is further electrically coupled to the ground potential 142. The second ground electrode 156, for example, generally defines a second ground aperture 158 through which the ion beam 144 passes.

In accordance with one exemplary aspect of the present disclosure, the first ground electrode 138 and second ground electrode 156 are fixedly coupled to one another, as well as both being electrically coupled to the electrical terminal ground potential 142. Further, the suppression electrode 150 may be fixedly coupled to one or more of the first ground electrode 138 and second ground electrode 156, while being further electrically insulated, therefrom. Thus, in one example, the ion source electrode system 122 may be moved relative to the ion source 110 as a unit, whereby the source gap 148 may be controlled without affecting the positions of the first ground electrode 138, second ground electrode 156, and suppression electrode 150 relative to one another. In another example, the first and second ground electrodes 138, 156 may be fixedly coupled to one another, while being independent of a position of the suppression electrode 150, whereby the first and second ground electrodes may be moved as a unit with respect to one or more of the source aperture 132 and suppression electrode 150.

The present disclosure contemplates any of the first ground electrode 138, suppression electrode 150, and second ground electrode 156 as further respectively comprising one of a single plate or two or more separate plates (not shown), whereby the first ground aperture 140, suppression aperture 154 and second ground aperture 158 may have a respective fixed or variable width, also known by those of skill in the art as variable aperture electrode (VAE).

The ion source electrode 130 and the suppression electrode 150 are electrically insulated from one another, as well as being electrically insulated from the first and second ground electrodes 138, 156. The suppression power supply 152 and source power supply 136, for example, are further coupled to a controller 160 (e.g., a control system) that is configured to generate control signals for controlling the potential on each of the suppression electrode 150 and ion source chamber 124, and in one example, further selectively controlling the gap 148. Accordingly, ion energy may be measured and used in a feedback loop to control parameters in ion generation, such as the gap 148, aperture width, aperture size, and aperture alignment, as well as the potential applied to the suppression electrode 150 and ion source chamber 124, etc. The controller 160, for example, may be further configured to generate a control signal for controlling various parameters of the ion beam 144 depending on the measured energy.

After passing through the ion source electrode system 122, the ion beam 144 enters the beamline assembly 104 and an associated mass analyzer magnet 162. The mass analyzer magnet 162, for example, can be realized at about a ninety degree angle, or another angle, whereby a magnetic field is generated therein. As the ion beam 144 enters the mass analyzer magnet 162, the ion beam is correspondingly bent by the magnetic field such that ions of an inappropriate charge-to-mass ratio are rejected. More particularly, ions having too great or too small of a charge-to-mass ratio are deflected into side walls 164 of the mass analyzer magnet 162. In this manner, the mass analyzer magnet 162 selectively allows only those ions which have the desired charge-to-mass ratio to remain in the beam 144 and to completely traverse therethrough.

The controller 160, for example, can adjust the strength and orientation of the magnetic field, among other properties. The magnetic field, for example, can be controlled by regulating the amount of electrical current running through coil windings of the mass analyzer magnet 162. It will be appreciated that the controller 160 may include a programmable micro-controller, processor and/or other type of computing mechanism for overall control of the ion implantation system 100 (e.g., by an operator, by previously and/or presently acquired data and/or programs).

A resolving aperture 166 proximate to an exit of the mass analyzer magnet 162, for example, can be adjusted according to the beam path 146. In one example, the resolving aperture 166 is movable about an x-direction so as to accommodate altered paths as they exit therethrough. In another example, the resolving aperture 166 is shaped so as to accommodate a selected range of altered paths. The mass analysis magnet 162 and the resolving aperture 166 allow variations in the magnetic field and resulting altered path while maintaining suitable mass resolution for the ion implantation system 100.

The ion beam 144, for example, may have a relatively narrow profile (e.g., a "pencil" or "spot" beam). It should be noted that while the ion beam 144 may be described as having a relatively narrow profile, the ion beam may alternatively have an elongate profile (e.g., a generally ovular cross-section when viewed from along the nominal beam path 146, and generally referred to as a "ribbon" ion beam), and all such ion beams are contemplated as falling within the scope of the present disclosure. In one example, a scanning and/or focusing system 168, is provided, whereby one or more of a scanning element 170 and a focusing and/or steering element 172 is provided for respectively scanning and focusing/steering the ion beam 144. In the presently illustrated example, the ion beam 144 is scanned by the scanning and/or focusing system 168 to define a scanned ion beam 174.

The scanned beam 174, for example, is passed through a parallelizer/corrector 176 which comprises dipole magnets 178 in the illustrated example. The dipole magnets 178 in the present example are substantially trapezoidal and are oriented to mirror one another to cause the beam 144 (e.g., the scanned ion beam 174) to bend into a substantially S-shape (e.g., the dipoles have equal angles and radii and opposite directions of curvature). The parallelizer/corrector 176 thus causes the scanned ion beam 174 to alter its path such that the beam travels parallel to a beam axis regardless of the scan angle. As a result, the implantation angle is relatively uniform across a workpiece 180 positioned on a workpiece support 182 in the end station 106.

One or more deceleration stages 184, for example, may be further located downstream of the parallelizer/corrector 176. Up to this point in the ion implantation system 100, the ion beam 144 is generally transported at a relatively high energy level to mitigate the propensity for beam blow up, which can be particularly high where beam density is elevated such as at a scan vertex 186, for example. The one or more deceleration stages 184, for example, can comprise one or more deceleration electrodes or lenses 188 operable to decelerate the ion beam 144.

It will be appreciated that the exemplary scanning element 170, focusing and/or steering element 172 and deceleration stage 184 may comprise any suitable number of electrodes or coils arranged and biased to accelerate and/or decelerate ions, as well as to focus, bend, deflect, converge, diverge, scan, parallelize and/or decontaminate the ion beam 144 such as provided in U.S. Pat. No. 6,777,696 to Rathmell et al. the entirety of which is hereby incorporated herein by reference.

The end station 106, for example, receives the ion beam 144 (e.g., the scanned ion beam 174) which is directed toward the workpiece 180. It is appreciated that different types of end stations 106 may be employed in the ion implantation system 100. For example, a "batch" type end station can simultaneously support multiple workpieces 180 on a rotating support structure (not shown), wherein the workpieces are rotated through the path of the ion beam 144 until all the workpieces are completely implanted. A "serial" type end station, on the other hand, supports a single workpiece 180 along the beam path 146 for implantation, wherein multiple workpieces are implanted one at a time in serial fashion, with each workpiece being serially implanted before implantation of the next workpiece begins. In hybrid systems the workpiece 180 may be mechanically translated in a first (Y or slow scan) direction while the ion beam 144 is scanned in a second (X or fast scan) direction to impart the ion beam over the entire workpiece 180.

The control system 160, for example, is further provided to control, communicate with and/or adjust the ion source 10, the mass analyzer 162, the resolving aperture 166, the scanning and/or focusing system 168, the parallelizer 178, and the deceleration stage 184. The control system 160 may comprise a computer, microprocessor, etc., and may be operable to take measurement values of beam characteristics and adjust parameters accordingly. The control system 160, for example, can be coupled to the terminal 102 from which the beam of ions is generated, as well as the mass analyzer 162 of the beamline assembly 104, the scanning element 170, the focusing and steering element 172, the parallelizer 178 and the deceleration stage 184 via one or more respective power supplies (not shown). Accordingly, any of these elements can be adjusted by the control system 160 to facilitate desired ion implantation. For example, the energy level of the beam can be adapted to adjust junction depths by adjusting the bias applied to source electrode 132 by the source power supply 136 and the bias supplied to the suppression electrode 150 by the suppression power supply 152, for example.

It will be appreciated that the beam current may be affected by many of the components of the ion implantation system 100. For example, respective biases on the ion source electrode 130 and the suppression electrode 150, with respect to the ground potential of the first ground electrode 138 and second ground electrode 156 can affect beam current of the ion beam 144. Accordingly, the beam current can be modulated by selectively controlling one or more of the ion source power supply 136 and the suppression power supply 152, respectively. It will be further appreciated that the first ground electrode 138 and second ground electrode 156 may be generally modulated with a voltage different from the ion source electrode 130 and the suppression electrode 150, while the voltage is equal in both the first ground electrode and second ground electrode, while be the same as or different from the terminal ground potential 142.

The voltage supplies discussed above can be controlled based on a measurement system 190 via the controller 160, for example, whereby the measurement system (e.g., including a Faraday cup) may provide an indication of the end-of-scan beam current of the scanned ion beam 174 that may be utilized during ion implantation.

Figure 3:
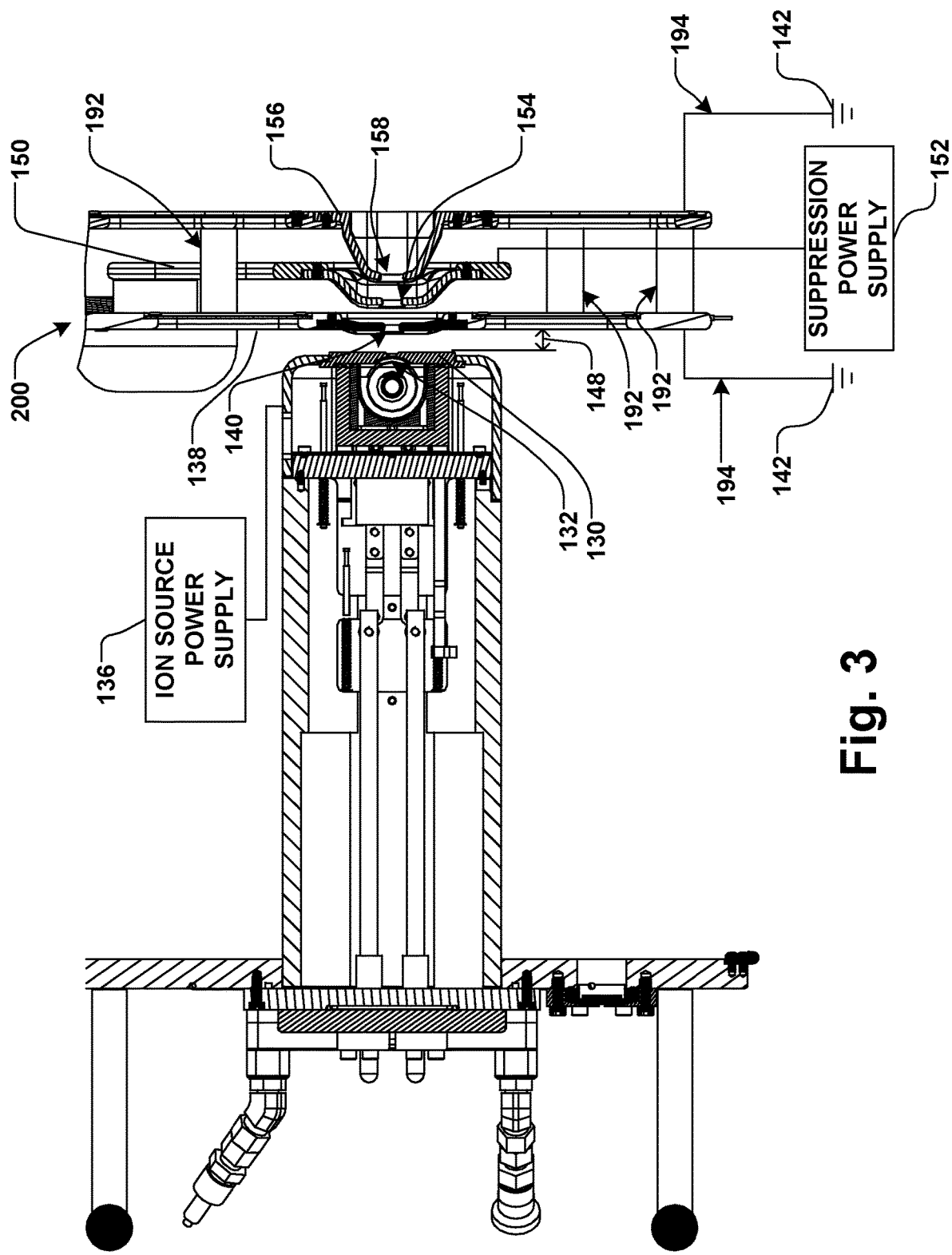
FIG. 3 is a cross sectional view of an ion source apparatus according to one aspect of the present invention.

In accordance with the present disclosure, referring now to FIG. 3, an exemplary ion source 110 and ion source electrode assembly 122 is illustrated in greater detail. As discussed above, the first ground electrode 138 and second ground electrode 156 are coupled to one another, whereby the first ground electrode and second ground electrode are electrically coupled to ground potential 142. As illustrated in FIG. 3, the first ground electrode 138 and second ground electrode 156 are coupled to one another by one or more ground rods 192, wherein the one or more ground rods fixedly couple the first ground electrode to the second ground electrode. The one or more ground rods 192, for example, are electrically conductive and electrically couple the first ground electrode 138 to the second ground electrode 156.

In one example, a grounding element 194 is further provided, whereby the grounding element is electrically coupled to one or more of the first ground electrode 138 and second ground electrode 156. The grounding element 194, for example, may comprise one or more of a wire, a cable, and a rod, wherein the grounding element electrically couples the first ground electrode 138 and second ground electrode 156 to ground potential 142 (e.g., terminal ground). Since the first ground electrode 138 and second ground electrode 156 are electrically coupled to one another, the present disclosure may advantageously provide a single electrical feedthrough 196 through a vacuum enclosure 198 of FIG. 2 for both the first ground electrode and second ground electrode.

In one example, the first ground electrode 138, suppression electrode 150, and second ground electrode 156 are fixedly coupled to one another, wherein the suppression electrode is electrically insulated from the first ground electrode and second ground electrode. The first ground electrode 138, suppression electrode 150, and second ground electrode 156, for example, generally define an extraction manipulator 200, wherein the extraction manipulator is configured to translate at least in one or more directions (e.g., one or more of the x-direction, y-direction, and z-direction) relative to the beamline.

Thus, an extraction scheme is provided utilizing a single gap extraction, for example, followed by an Einzel lens, whereby strong focusing capabilities achieve low beam divergence and enhanced beam transport through the AMU magnet while still preventing electrons from streaming back to the source. FIGS. 4 and 5 illustrate an example of the extraction manipulator 200, whereby the suppression electrode 150 is supported by, and electrically insulated from, the first ground electrode 138 via one or more insulators 202.

Accordingly, the present disclosure advantageously provides the first ground electrode 138 to extract the ion beam 144 from the ion source 110, whereas conventional systems provide a negatively biased electrode with respect to the source that typically requires a separate feedthrough and power supply, thus increasing cost and introducing reliability issues associated with the vacuum feedthrough (e.g., feedthrough coating and shorting, etc.) for the negatively biased electrode. The present disclosure electrically and physically couples the first and second ground electrodes 138, 156, whereby a single vacuum feedthrough can be utilized for coupling to electrical ground potential.

The present disclosure further provides better thermal expansion characteristics, as well as better beam correction over conventional systems. For example, as ions are extracted from the ion source 110, the ions are deflected by the magnetic field associated with the ion source. Such deflection is largest in the extraction gap 148, since the ions will have the lowest energy upon exiting the ion source, and wherein the source magnetic field will also be the strongest. To correct for such deflection, the entire extraction manipulator 200 may be moved, accordingly. Different species of ion beams, such as boron, arsenic, phosphorus, etc. may be utilized in the ion implantation system 100, whereby different extraction energies are accordingly provided. As such, different settings and corrections having different source magnetic fields may be varied, and the present disclosure provides additional flexibility for such instances.

The present disclosure provides for a compact extraction manipulator 200, thus increasing reliability, has fewer insulators to become coated with residue, and provides fewer failure mechanisms over conventional systems, whereby electrode alignment issues are reduced.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrode system for an ion source, the electrode system comprising:
   a source electrode associated with the ion source, wherein the source electrode generally defines a source aperture in an outside wall of an ion source chamber, and wherein the source aperture is configured to be electrically coupled to a source power supply;
   a first ground electrode positioned proximate to the source electrode, wherein the first ground electrode generally defines a first ground aperture, wherein the first ground electrode is electrically coupled to an electrical ground potential and configured to extract ions from the ion source along a beamline;
   a suppression electrode positioned downstream of the first ground electrode along the beamline, wherein the suppression electrode generally defines a suppression aperture, and wherein the suppression electrode is configured to be electrically coupled to a suppression power supply; and
   a second ground electrode positioned downstream of the suppression electrode along the beamline, wherein the second ground electrode generally defines a second ground aperture, and wherein the first ground electrode and second ground electrode are fixedly coupled to one another and are electrically coupled to the electrical ground potential.

2. The electrode system of claim 1, wherein source electrode is electrically isolated from the first ground electrode by a source gap.

3. The electrode system of claim 1, wherein the source power supply is configured to supply a source voltage to the source electrode that is positive relative to the ground potential.

4. The electrode system of claim 3, wherein the suppression power supply is configured to apply a negative potential to the suppression electrode relative to the source electrode.

5. The electrode system of claim 1, further comprising one or more ground rods, wherein the one or more ground rods fixedly couple the first ground electrode to the second ground electrode.

6. The electrode system of claim 5, wherein the one or more ground rods are electrically conductive and electrically couple the first ground electrode to the second ground electrode.

7. The electrode system of claim 5, further comprising a grounding element electrically coupled to one or more of the first ground electrode and second ground electrode, wherein the grounding element electrically couples the first ground electrode and second ground electrode to terminal ground.

8. The electrode system of claim 7, wherein the grounding element comprises one or more of a wire, a cable, and a rod.

9. The electrode system of claim 1, wherein the first ground electrode, suppression electrode, and second ground electrode are fixedly coupled to one another, wherein the suppression electrode is electrically insulated from the first ground electrode and second ground electrode.

10. The electrode system of claim 9, wherein the first ground electrode, suppression electrode, and second ground electrode generally define an extraction manipulator, wherein the extraction manipulator is configured to translate at least in one or more directions relative to the beamline.

11. The ion source of claim 1, further comprising one or more ground rods, wherein the one or more ground rods fixedly couple the first ground electrode to the second ground electrode.

12. The ion source of claim 11, wherein the one or more ground rods are electrically conductive and electrically couple the first ground electrode to the second ground electrode.

13. An ion source for an ion implantation system, the ion source comprising:
   an arc chamber having an interior region, wherein the arc chamber is configured to form a plasma containing positive ions;
   a source electrode, wherein the source electrode generally defines a source aperture in an outside wall of the arc chamber and generally encloses the interior region of the arc chamber, and wherein the source aperture is configured to be electrically coupled to a source power supply;
   a first ground electrode positioned proximate to the source electrode, wherein the first ground electrode generally defines a first ground aperture, wherein the first ground electrode is electrically coupled to an electrical ground potential and configured to extract the positive ions from the ion source along a beamline;
   a suppression electrode positioned downstream of the first ground electrode along the beamline, wherein the suppression electrode generally defines a suppression aperture, and wherein the suppression electrode is configured to be electrically coupled to a suppression power supply; and
   a second ground electrode positioned downstream of the suppression electrode along the beamline, wherein the second ground electrode generally defines a second ground aperture, and wherein the first ground electrode and second ground electrode are fixedly coupled to one another and are electrically coupled to the electrical ground potential.

14. The ion source of claim 13, wherein source electrode is electrically isolated from the first ground electrode by a source gap.

15. The ion source of claim 13, wherein the suppression power supply is configured to apply a negative potential to the suppression electrode relative to the first and second ground electrodes.

16. The ion source of claim 13, wherein the first ground electrode, suppression electrode, and second ground electrode are fixedly coupled to one another, wherein the suppression electrode is electrically insulated from the first ground electrode and second ground electrode.

17. The ion source of claim 16, wherein the first ground electrode, suppression electrode, and second ground electrode generally define an extraction manipulator, wherein the extraction manipulator is configured to translate at least in one or more directions relative to the beamline.

18. An ion implantation system, comprising:
an ion source configured to form a plasma;
a source power supply;
a suppression power supply;
an electrode system comprising:
   a source electrode, wherein the source electrode generally defines a source aperture in an outside wall of the ion source and generally encloses the interior region of the ion source, and wherein the source aperture, and wherein the source electrode is electrically coupled to the source power supply;
   a first ground electrode positioned proximate to the source electrode, wherein the first ground electrode generally defines a first ground aperture, wherein the first ground electrode is electrically coupled to an electrical ground potential and configured to extract the positive ions from the ion source, thereby defining an ion beam along a beamline;
   a suppression electrode positioned downstream of the first ground electrode along the beamline, wherein the suppression electrode generally defines a suppression aperture, and wherein the suppression electrode is electrically coupled to the suppression power supply;
   a second ground electrode positioned downstream of the suppression electrode along the beamline, wherein the second ground electrode generally defines a second ground aperture, and wherein the first ground electrode and second ground electrode are fixedly coupled to one another and are electrically coupled to the electrical ground potential; and
   one or more electrically conductive ground rods, wherein the one or more ground rods fixedly couple and electrically couple the first ground electrode to the second ground electrode;
a mass analyzer configured to mass analyze the ion beam along the beamline;
an acceleration/deceleration apparatus configured to accelerate or decelerate the ion beam to a desired implantation energy; and
an end station configured to support a workpiece for implantation along the beamline.

19. The ion implantation system of claim 18, further comprising:
a vacuum chamber generally enclosing at least the ion source and electrode system, wherein the source power supply and suppression power supply are not enclosed within the vacuum chamber;
a vacuum source configured to provide a vacuum within the vacuum chamber; and
one or more vacuum feedthroughs associated with the vacuum chamber, wherein the one or more vacuum feedthroughs are configured to electrically couple the source power supply and suppression power supply to the respective source electrode and suppression electrode while maintaining the vacuum within the vacuum chamber.

20. The ion implantation system of claim 18, wherein the one or more vacuum feedthroughs are further configured to electrically couple the first ground electrode and second electrode to a terminal ground potential external to the vacuum chamber while maintaining the vacuum within the vacuum chamber.

* * * * *